(12) United States Patent
Chou et al.

(10) Patent No.: US 10,636,841 B2
(45) Date of Patent: Apr. 28, 2020

(54) MAGNETORESISTIVE RANDOM ACCESS MEMORY

(71) Applicant: UNITED MICROELECTRONICS CORP., Hsin-Chu (TW)

(72) Inventors: Kun-I Chou, Tainan (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/170,018

(22) Filed: Oct. 24, 2018

(65) Prior Publication Data

US 2020/0083287 A1 Mar. 12, 2020

(30) Foreign Application Priority Data

Sep. 7, 2018 (CN) .......................... 2018 1 1044167

(51) Int. Cl.
*H01L 29/82* (2006.01)
*H01L 27/22* (2006.01)
*H01L 43/08* (2006.01)

(52) U.S. Cl.
CPC ............ *H01L 27/228* (2013.01); *H01L 43/08* (2013.01)

(58) Field of Classification Search
CPC ... H01L 27/228; H01L 43/08; H01L 21/4763; G11C 11/16; G11C 11/02
See application file for complete search history.

(56) References Cited

U.S. PATENT DOCUMENTS

| 9,275,714 | B1 | 3/2016 | Kim et al. | |
| 2003/0223283 | A1* | 12/2003 | Kunikiyo | G11C 8/16 365/200 |
| 2004/0113187 | A1* | 6/2004 | Cha | B82Y 10/00 257/295 |
| 2011/0254112 | A1* | 10/2011 | Yamanaka | H01L 21/7684 257/421 |
| 2012/0154416 | A1* | 6/2012 | Nakanishi | G09G 3/2092 345/559 |
| 2012/0241880 | A1* | 9/2012 | Noma | H01L 27/105 257/421 |
| 2013/0028010 | A1 | 1/2013 | Li et al. | |

* cited by examiner

*Primary Examiner* — Phuc T Dang
(74) *Attorney, Agent, or Firm* — Winston Hsu

(57) ABSTRACT

A semiconductor device includes: a first metal-oxide semiconductor (MOS) transistor and a second MOS transistor on a substrate; a magnetic tunneling junction (MTJ) between the first MOS transistor and the second MOS transistor; a first interlayer dielectric (ILD) layer on one side of the MTJ and above the first MOS transistor; and a second ILD layer on another side of the MTJ and above the second MOS transistor.

14 Claims, 1 Drawing Sheet

MAGNETORESISTIVE RANDOM ACCESS MEMORY

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes: a first metal-oxide semiconductor (MOS) transistor and a second MOS transistor on a substrate; a magnetic tunneling junction (MTJ) between the first MOS transistor and the second MOS transistor; a first interlayer dielectric (ILD) layer on one side of the MTJ and above the first MOS transistor; and a second ILD layer on another side of the MTJ and above the second MOS transistor.

According to an embodiment of the present invention, the first MOS transistor further includes: a first gate structure on the substrate; a first spacer around the first gate structure; and a first source/drain region on one side of the first gate structure.

According to an embodiment of the present invention, the second MOS transistor further includes: a second gate structure on the substrate; a second spacer around the second gate structure; a second source/drain region on one side of the second gate structure, a first liner between the first spacer and the first ILD layer, and a second liner between the second spacer and the second ILD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
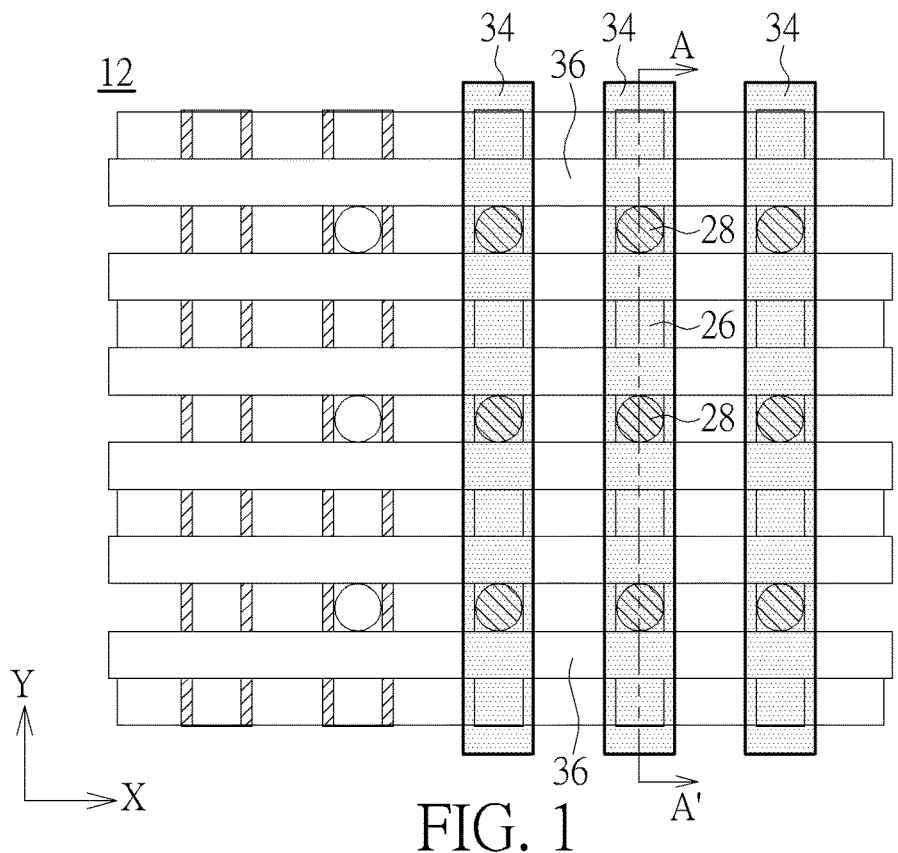
FIG. 1 illustrates a top view of a MRAM unit according to an embodiment of the present invention.
Figure 2:
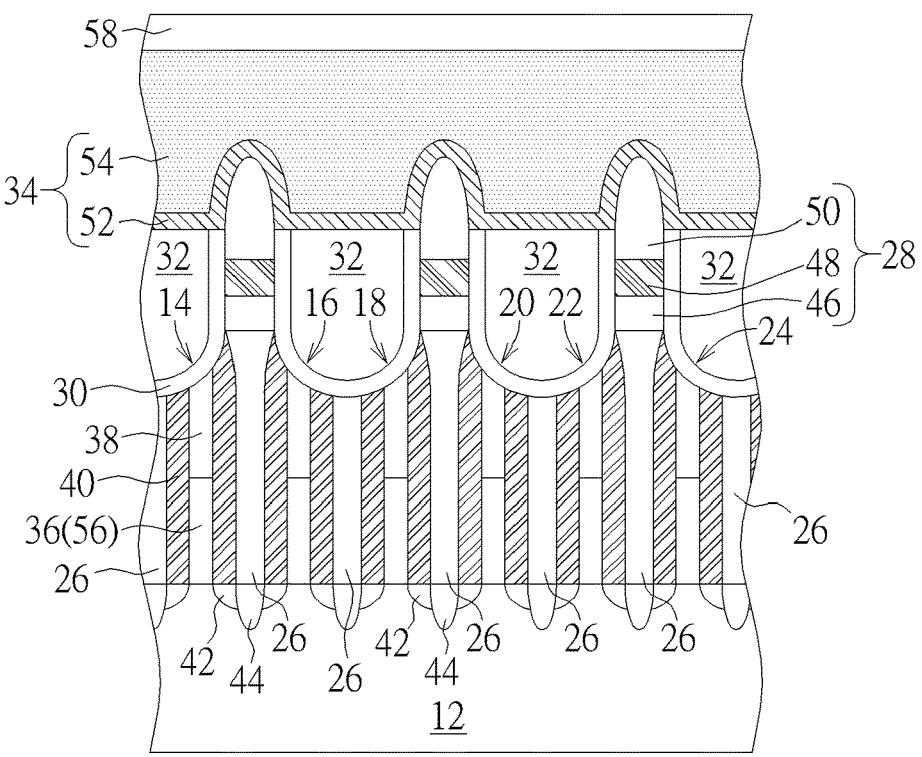
FIG. 2 illustrates a cross-section view of FIG. 1 along the sectional line AA'.

Referring to FIGS. 1-2, FIGS. 1-2 illustrate a semiconductor device or more specifically a MRAM unit according to an embodiment of the present invention, in which FIG. 1 illustrates a top view of the MRAM unit while FIG. 2 illustrates a cross-section view of FIG. 1 along the sectional line AA'. As shown in FIGS. 1-2, a substrate 12 made of semiconductor material is first provided, in which the substrate 12 is preferably a p-type substrate selected from the group consisting of silicon, germanium, silicon-germanium compounds, silicon carbide, and gallium arsenide (GaAs).

Next, a plurality of active devices such as metal-oxide semiconductor (MOS) transistors 14, 16, 18, 20, 22, 24 are formed on the substrate 12, contact plugs 26 are formed between the MOS transistors 14, 16, 18, 20, 22, 24, MTJs 28 are formed to electrically connect the contact plugs 26 between the MOS transistors 14, 16, 18, 20, 22, 24, liners 30 and interlayer dielectric (ILD) layer 32 are formed surrounding the MTJs 28, a metal interconnections 34 are formed above the ILD layer 32 and MTJs 28, and inter-metal dielectric (IMD) layer 58 is formed on the metal interconnection 34.

In this embodiment, each of the MOS transistors 14, 16, 18, 20, 22, 24 includes a gate structure 36 disposed on the substrate 12, a hard mask 38 on the gate structure 36, a spacer 40 around the gate structure 36 and the hard mask 38, and a lightly doped drain (LDD) 42 and source/drain region 44 in the substrate 12 adjacent to two sides of each of the gate structures 36. Preferably, each of the gate structures 36 serves as a word line (WL) 56 for the MRAM unit and the contacts plugs 26 disposed adjacent to the gate structures 36 or word lines could include contact plugs connected to the scan lines or bit lines. As shown in the top view of FIG. 1, each of the gate structures 36 or word lines are disposed extending along a first direction such as X-direction while the metal interconnections 34 above the MTJs 28 and ILD layer 32 are disposed extending along a second direction perpendicular to the first direction such as Y-direction.

In this embodiment, each of the gate structure 36 further includes a gate dielectric layer (not shown) and a gate material layer or gate electrode disposed on the gate dielectric layer, in which the gate dielectric layer could include silicon dioxide, silicon nitride, or high-k dielectric material while the gate electrode could include conductive material such as but not limited to for example metals, polysilicon, or silicides.

In this embodiment, each of the spacers 40 is preferably a single spacer selected from the group consisting of silicon oxide, silicon nitride (SiN), silicon oxynitride (SiON), and silicon carbon nitride (SiCN). Nevertheless, according to an embodiment of the present invention, each of the spacers 40 could also be a composite spacer depending on the demand of the process. For instance, each of the spacers 40 could further includes a first sub-spacer (not shown) and a second sub-spacer (not shown), one of the first sub-spacer and the second sub-spacer could have a L-shaped or I-shaped cross-section, the first sub-spacer and the second sub-spacer could be made of same material or different materials while both the first sub-spacer and the second sub-spacer could be selected from the group consisting of silicon oxide, silicon nitride (SiN), silicon oxynitride (SiON), and silicon carbon nitride (SiCN), which are all within the scope of the present invention. It should also be noted that all of the MOS transistors 14, 16, 18, 20, 22, 24 disclosed in this embodiment are preferably NMOS transistors so that the LDDs 42 and the source/drain regions 44 preferably includes n-type dopants.

In this embodiment, each of the MTJs 28 preferably includes a bottom electrode 46, a fixed layer, a free layer 48, a capping layer, and a top electrode 50. Preferably, the bottom electrode 46 and the top electrode 50 are preferably made of conductive material including but not limited to for example Ta, Pt, Cu, Au, Al, or combination thereof. The fixed layer could be made of antiferromagnetic (AFM) material including but not limited to for example ferromanganese (FeMn), platinum manganese (PtMn), iridium manganese (IrMn), nickel oxide (NiO), or combination thereof, in which the fixed layer is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer could be made of insulating material including but not limited to for example oxides such as aluminum oxide ($AlO_x$) or magnesium oxide (MgO).

Preferably, each of the metal interconnections 34 could be embedded within an IMD layer (not shown) above the ILD layer 32 according to a single damascene process or dual damascene process. For instance, each of the metal interconnections 34 could further include a barrier layer 52 and a metal layer 54, in which the barrier layer 52 could be selected from the group consisting of titanium (Ti), titanium nitride (TiN), tantalum (Ta), and tantalum nitride (TaN) and the metal layer 54 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity.

It should be noted that the MRAM unit of this embodiment preferably employs a design of not disposing any isolation structures other than the ILD layer 32 between the MTJs 28, in which the isolation structures could be made of any insulating material. That is in contrast to having a word line on one side of the MTJ and a dummy word line on another side of the MTJ or having an ILD layer on one side of the MTJ and an isolation structure connected to dummy word line on another side of the MTJ as in conventional MRAM unit, the MRAM unit of this embodiment preferably having symmetrical word line structures 56 adjacent to two sides of each of the MTJs 28, no additional dummy word lines are disposed adjacent to either sides of each of the MTJs 28, and the ILD layer 32 disposed adjacent two sides of each of the MTJs 28 are also made of same composition and same size.

For instance, the MTJ 28 between the MOS transistor 18 and the MOS transistor 20 shown in FIG. 2 preferably having a MOS transistor 18 on one side of the MTJ 28 and another MOS transistor 20 on another side of the MTJ 28, in which a source/drain region 44 is disposed in the substrate 12 adjacent to one side of the MOS transistor 18, another source/drain region 44 is disposed in the substrate 12 adjacent to another side of the MOS transistor 20, and a common or shared source/drain region 44 is disposed in the substrate 12 between the MOS transistors 18 and 20. Preferably, the common source/drain region 44 in the middle is electrically connected or directly contacting a contact plug 26 and the contact plug 26 disposed between the two MOS transistors 18, 20 further contacts the bottom surface of the MTJ 28 directly, in which ILD layer 32 and liner 30 are disposed above the word line 56 and the spacer 40 on one side of the MTJ 28, and symmetrical ILD layer 32 and liner 30 are also disposed above the word line 56 and spacer 40 on another side of the MTJ 28. The liner 30 is preferably disposed between the ILD layer 32 and the hard mask 38 (and/or the spacer 40) while covering sidewalls of the MTJ 28, the liner 30 preferably includes a U-shaped cross-section, and a top surface of the liner 30 is even with a top surface of the ILD layer 32.

Viewing from another perspective, a pair of symmetrical gate structures 36 or word lines 56 are disposed adjacent to two sides of each of the MTJs 28 on the surface of the substrate 12, no dummy word lines are disposed adjacent to two sides of each of the MTJs 28, and symmetrical liners 30 and ILD layers 32 are disposed adjacent to two sides of each of the MTJs 28 above the word lines 56 instead of asymmetric design having an ILD layer on one side of the MTJ and isolation structure on another side of the MTJ as found in conventional art. Preferably the definition of symmetry such as symmetrical gate structures and/or symmetrical ILD layers in this embodiment could be understood as elements including gate structure 36, liners 30, and/or ILD layers 32 adjacent to two sides of each of the MTJs 28 could share same shape, same widths, same heights, same size, and/or same area. In this embodiment, the ILD layer 32 and the liner 30 are preferably made of different materials, in which the ILD layer 32 is preferably made of silicon oxide while the liner 30 is made of silicon nitride. Nevertheless, according to an embodiment of the present invention, the ILD layer 32 and the liner 30 could also be made of same material while the two elements could all be selected from the group consisting of silicon oxide, silicon nitride (SiN), silicon oxynitride (SiON), and silicon carbon nitride (SiCN).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first metal-oxide semiconductor (MOS) transistor and a second MOS transistor on a substrate;
   a magnetic tunneling junction (MTJ) between the first MOS transistor and the second MOS transistor;
   a first interlayer dielectric (ILD) layer on one side of the MTJ and above and covers the first MOS transistor; and
   a second ILD layer on another side of the MTJ and above and covers the second MOS transistor.

2. The semiconductor device of claim 1, wherein the first MOS transistor comprises:
   a first gate structure on the substrate;
   a first spacer around the first gate structure; and
   a first source/drain region on one side of the first gate structure.

3. The semiconductor device of claim 2, wherein the second MOS transistor comprises:
- a second gate structure on the substrate;
- a second spacer around the second gate structure; and
- a second source/drain region on one side of the second gate structure.

4. The semiconductor device of claim 3, further comprising:
- a first liner between the first spacer and the first ILD layer; and
- a second liner between the second spacer and the second ILD layer.

5. The semiconductor device of claim 4, wherein top surfaces of the first liner and the first ILD layer are coplanar.

6. The semiconductor device of claim 4, wherein top surfaces of the second liner and the second ILD layer are coplanar.

7. The semiconductor device of claim 3, further comprising a third source/drain region between the first gate structure and the second gate structure.

8. The semiconductor device of claim 7, further comprising a contact plug between the first spacer and the second spacer and contacting the third source/drain region directly.

9. The semiconductor device of claim 8, wherein the MTJ is connected to the contact plug.

10. The semiconductor device of claim 8, wherein the MTJ is directly on top of the contact plug.

11. The semiconductor device of claim 3, wherein the first gate structure and the second gate structure are extending along a first direction on the substrate.

12. The semiconductor device of claim 11, further comprising a metal interconnection extending along a second direction on the first ILD layer and the second ILD layer.

13. The semiconductor device of claim 1, wherein the first MOS transistor and the second MOS transistor comprise a same conductive type.

14. The semiconductor device of claim 1, wherein each of the first MOS transistor and the second MOS transistor comprises a NMOS transistor.

\* \* \* \* \*